(12) United States Patent  
Schaefer et al.

(10) Patent No.: US 11,316,506 B1  
(45) Date of Patent: Apr. 26, 2022

(54) SIGNAL ANALYSIS METHOD AND SIGNAL ANALYSIS MODULE

(71) Applicant: Rohde & Schwarz GmbH & Co. KG, Munich (DE)

(72) Inventors: Andrew Schaefer, Munich (DE); Iqbal Bawa, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/070,711

(22) Filed: Oct. 14, 2020

(51) Int. Cl.
| | |
|---|---|
| *H03K 7/02* | (2006.01) |
| *H03K 7/08* | (2006.01) |
| *H03K 17/30* | (2006.01) |
| *H04L 7/00* | (2006.01) |

(52) U.S. Cl.  
CPC ............... *H03K 7/02* (2013.01); *H03K 7/08* (2013.01); *H03K 17/30* (2013.01); *H04L 7/0087* (2013.01)

(58) Field of Classification Search  
CPC . H03K 7/02; H03K 7/08; H03K 17/30; H04L 7/0087  
See application file for complete search history.

(56) References Cited

U.S. PATENT DOCUMENTS

| | | | |
|---|---|---|---|
| 9,184,906 B1* | 11/2015 | Min | H04L 7/0016 |
| 2009/0252258 A1* | 10/2009 | Aoyagi | H04L 25/49 |
| | | | 375/329 |
| 2018/0227162 A1 | 8/2018 | Tokuhiro | |
| 2018/0278405 A1* | 9/2018 | Yao | H03L 7/0807 |
| 2020/0374160 A1* | 11/2020 | Wang | H04L 25/4917 |

* cited by examiner

*Primary Examiner* — Dac V Ha  
(74) *Attorney, Agent, or Firm* — Christensen O'Connor Johnson Kindness PLLC

(57) ABSTRACT

A signal analysis method for analyzing a pulse modulated input signal is described. The signal analysis method includes: receiving the pulse modulated input signal, the input signal including a symbol sequence; recovering a clock signal from the input signal, the clock signal being associated with the input signal; sampling the input signal based on the clock signal, thereby obtaining a set of input signal samples, each of the input signal samples having a certain level being constant over time; determining at least two different levels of input signal samples being associated with different symbols of the symbol sequence; and determining at least one decision threshold based on the at least two different levels determined previously, the decision threshold being associated with a symbol transition of the symbol sequence. Further, a signal analysis apparatus is described.

19 Claims, 3 Drawing Sheets

SIGNAL ANALYSIS METHOD AND SIGNAL ANALYSIS MODULE

FIELD OF THE DISCLOSURE

Embodiments of the present disclosure generally relate to a signal analysis method for analyzing a pulse modulated input signal. Embodiments of the present disclosure further relate to a signal analyzer for analyzing a pulse modulated input signal.

BACKGROUND

In the state of the art, it is known to analyze pulse modulated signals by a signal analyzing instrument like an oscilloscope. For instance, the respective pulse modulated signals correspond to pulse width modulated (PWM) signals, pulse density modulated (PDM) signals, or pulse amplitude modulated (PAM) signals.

One of the critical parameters required for decoding pulse modulated signals is an appropriate setting of a decision threshold for symbol detection. A correctly set decision threshold is particularly important for signals having a low signal-to-noise ratio, strong inter-symbol interference and/or several different possible symbol values.

Current methods for determining the decision thresholds either require a user to set the decision thresholds manually, or involve an automatic calculation of the decision thresholds based directly on samples being associated with the signal.

However, it has turned out that the accuracy of the obtained decision thresholds may not be sufficient, e.g. if the signal that is to be decoded is rather noisy. Moreover, setting the decision thresholds manually is rather tedious and requires a considerable amount of expertise from a user.

Accordingly, there is a need for a signal analysis method and a signal analysis module that allow for a more precise and easier decoding of a pulse modulated signal.

SUMMARY

Embodiments of the present disclosure provide a signal analysis method for analyzing a pulse modulated input signal. In an embodiment, the signal analysis method comprises the following steps:

receiving the pulse modulated input signal, the input signal comprising a symbol sequence;

recovering a clock signal from the input signal, the clock signal being associated with the input signal;

sampling the input signal based on the clock signal, thereby obtaining a set of input signal samples, each of the input signal samples having a certain level being constant over time;

determining at least two different levels of input signal samples being associated with different symbols of the symbol sequence; and determining at least one decision threshold based on the at least two different levels determined previously, the decision threshold being associated with a symbol transition of the symbol sequence.

According to the present disclosure, the clock signal is recovered based directly on the input signal or based on samples that are associated with the input signal. Hence, the clock signal is recovered directly or rather indirectly from the input signal.

If the input signal is established as an analog input signal, the input signal may be digitized and the steps described above may be performed based on the digitized input signal.

In the state of the art, the decision threshold is either set manually or is determined directly based on the input signal or rather samples being associated with the input signal.

The signal analysis method according to the present disclosure is based on the idea to determine the at least one decision threshold after the clock recovery. After the clock recovery, the individual portions of the input signal can be unambiguously attributed to certain symbols.

More precisely, the input signal is sampled such that each input signal sample corresponds to exactly one symbol. The level of each input signal sample is constant for the symbol duration of the respective symbol, wherein the symbol duration is defined by the clock signal.

If the input signal is already digital or digitized, the input signal may be re-sampled in order to obtain the set of input signal samples.

The levels of the input signal samples may be far less noisy than the original input signal, as the level of the individual input signal samples can only vary after every symbol duration.

In some embodiments, the levels of the input signal samples associated with different symbols of the symbol sequence are also called symbol amplitude levels or rather levels at symbol domain. Therefore, the symbol amplitude levels differ from the signal levels of the (analog/digitized) input signal, which are prior to the clock data recovery (CDR). In contrast thereto, the symbol amplitude levels are associated with the input signal samples obtained after the clock data recovery.

In other words, the levels of the input signal samples associated with different symbols of the symbol sequence (symbol amplitude levels) relate to the actual amplitude levels in symbol domain, namely after clock data recovery.

It is to be noted that the actual amplitude levels in symbol domain may differ from the (ideal) symbol levels.

The at least one decision threshold is then determined based on the at least two different levels determined previously. The at least one decision threshold can be determined with higher accuracy, as the input signal samples used for determining the at least two different levels carry less perturbations compared to the original input signal, for example the signal levels of the original input signal or rather the sample levels.

Moreover, no user input is necessary, as the at least one decision threshold can be determined in a fully automatic manner by the signal analysis method described above.

In addition, the at least one decision threshold determined may be set afterwards. In other words, the at least one decision threshold determined is applied when analyzing the pulse modulated input signal, for example decoding the pulse modulated input signal.

According to an aspect of the present disclosure, the at least two different levels are associated with at least one of a maximum level of the symbol sequence and a minimum level of the symbol sequence. In some embodiments, the maximum level relates to a maximally possible level, i.e. to the level being associated with the highest symbol value. Likewise, the minimum level may relate to a minimally possible level, i.e. to the level being associated with the lowest symbol value.

In general, the input signal sample having the highest level of all input signal samples is associated with the maximum level. Likewise, the input signal sample having the lowest level of all input signal samples is associated with the minimum level. Accordingly, the at least one decision threshold may be determined based on the highest level of all input signal samples and/or based on the lowest level of all input signal samples.

For example, if the symbol sequence is a bit sequence, then there are two different possible levels that are associated with the bit level "0" and the bit level "1", respectively. Accordingly, the maximum level corresponds to the bit level "1", while the minimum level corresponds to the bit level "0".

In a further embodiment of the present disclosure, at least one of an average over several levels of input signal samples being associated with a maximum level or an average over several levels of input signal samples being associated with a minimum level is determined. More precisely, a predefined number of input signal samples having the highest levels may be averaged and/or a predefined number of input signal samples having the lowest levels may be averaged. The at least one decision threshold may be determined based on the average over several levels of input signal samples being associated with the maximum level and/or based on the average over several levels of input signal samples being associated with the minimum level. This way, influences of statistic perturbations are reduced, and the at least one decision threshold can be determined with higher accuracy.

According to another aspect of the present disclosure, a level difference between the at least two different levels is determined, wherein the at least one decision threshold is determined based on the level difference. In some embodiments, a level difference between the highest level of the input signal samples and the lowest level of the input signal samples may be determined in order to determine the at least one decision threshold.

Alternatively or additionally, a level difference between the average over several levels of input signal samples being associated with a maximum level and the average over several levels of input signal samples being associated with a minimum level is determined, wherein the at least one decision threshold is determined based on the level difference of the averages.

In a further embodiment of the present disclosure, the at least one decision threshold $A_{th}$ is determined according to the equation $A_{th,i}=A_{max}-(2k+1)\ p\ \Delta A$ or according to the equation $A_{th,i}=A_{min}+(2k+1)\ p\ \Delta A$, wherein $A_{max}$ corresponds to a maximum level of the input signal samples, wherein $A_{min}$ corresponds to a minimum level of the input signal samples, wherein k is an integer equal to or bigger than zero, wherein $\Delta A$ corresponds to the level difference, and wherein p is a proportionality factor. In general, the proportionality factor p may depend on the actual modulation type of the input signal. In other words, the at least one decision threshold may be determined based on the maximum level of the input signal samples, the minimum level of the input signal samples, and based on the modulation-dependent proportionality factor p.

In some embodiments, the level difference $\Delta A$ is equal to the difference between the maximum level of the input signal samples and the minimum level of the input signal samples, i.e. $\Delta A=A_{max}-A_{min}$.

Alternatively, the level difference $\Delta A$ may be equal to the difference between the average over several levels of input signal samples being associated with the maximum level and the average over several levels of input signal samples being associated with the minimum level.

The proportionality factor may be determined based on an overall number of possible different levels of the symbol sequence. For several different types of modulations, the distance between neighboring levels of the symbol sequence is (approximately) constant. Accordingly, the proportionality factor may be determined directly based on the overall number N of possible different levels according to $p=1/(2(N-1))$. This way, the decision thresholds are located half way between respective pairs of neighboring levels of the symbol sequence.

In some embodiments, the input signal is established as a pulse amplitude modulated (PAM)-N signal, wherein N is an integer bigger than 1. For example, the input signal may be established as a PAM-3 signal or as a PAM-4 signal. Accordingly, the signal analysis method described above may be used, e.g., for Gigabit Ethernet applications, for example according to the 1000Base-T1 standard.

Alternatively, the input signal may be established as a non-return-to-zero (NRZ) signal, among others.

In a further embodiment of the present disclosure, the input signal is decoded based on the at least one decision threshold. In other words, the symbol values of the individual symbols of the symbol sequence are determined based on the at least one decision threshold. As already described above, the at least one decision threshold can be determined with high accuracy and without additional user input by the signal analysis method according to the present disclosure. Accordingly, the input signal can be decoded with a lower symbol error rate and without additional user input.

A level of the input signal may be compared with the at least one decision threshold in order to decode the input signal. In general, the decision thresholds define decision corridors that are each associated with one particular symbol value. Thus, the values of the individual symbols of the symbol sequence can be determined by identifying the respective decision corridor in which the input signal is located at a particular decision time.

According to another aspect of the present disclosure, the level of the input signal and the at least one decision threshold are compared at symbol times, the symbol times being defined by the clock signal. In general, the symbol time is located in an inner portion of the respective symbol, for example in the middle of the respective symbol. In other words, the symbol time is located rather far away from potential signal edges and the usual deformations of the input signal being associated with the signal edges. Accordingly, the input signal can be decoded with higher precision by comparing the input signal and the at least one decision threshold at the symbol times rather than at the edge times.

Embodiments of the present disclosure further provide a signal analyzer or module composed, for example, of one or more circuits for analyzing a pulse modulated input signal. The signal analysis module comprises an input, a clock recovery circuit or module, and a signal decoder circuit or module. The input is configured to receive a pulse modulated input signal, wherein the input signal comprises a symbol sequence. The clock recovery module is configured to recover a clock signal from the input signal, wherein the clock signal is associated with the input signal. The signal decoder module is configured to sample the input signal based on the clock signal, thereby obtaining a set of input signal samples, wherein each of the input signal samples has a certain level being constant over time. The signal decoder module is configured to determine at least two different levels of input signal samples being associated with different symbols of the symbol sequence. The signal decoder module further is configured to determine at least one decision threshold based on the at least two different levels, wherein the decision threshold is associated with a symbol transition of the symbol sequence.

In some embodiments, the signal analysis module is configured to perform the signal analysis method described above.

Regarding the advantages and further properties of the signal analysis module, reference is made to the explanations given above with respect to the signal analysis method, which also hold for the signal analysis module and vice versa.

According to an aspect of the present disclosure, the at least two different levels are associated with at least one of a maximum level of the symbol sequence and a minimum level of the symbol sequence, respectively. In some embodiments, the maximum level relates to a maximally possible level, i.e. to the level being associated with the highest symbol value. Likewise, the minimum level may relate to a minimally possible level, i.e. to the level being associated with the lowest symbol value.

In general, the input signal sample having the highest level of all input signal samples is associated with the maximum level. Likewise, the input signal sample having the lowest level of all input signal samples is associated with the minimum level. Accordingly, the at least one decision threshold may be determined based on the highest level of all input signal samples and/or based on the lowest level of all input signal samples.

For example, if the symbol sequence is a bit sequence, then there are two different possible levels that are associated with the bit level "0" and the bit level "1", respectively. Accordingly, the maximum level corresponds to the bit level "1", while the minimum level corresponds to the bit level "0".

The signal decoder module may be configured to determine at least one of an average over several levels of input signal samples being associated with a maximum level, and an average over several levels of input signal samples being associated with a minimum level. More precisely, a predefined number of input signal samples having the highest levels may be averaged, and/or a predefined number of input signal samples having the lowest levels may be averaged. The at least one decision threshold may be determined based on the average over several levels of input signal samples being associated with the maximum level and/or based on the average over several levels of input signal samples being associated with the minimum level. This way, influences of statistic perturbations are reduced, and the at least one decision threshold can be determined with higher accuracy.

According to another aspect of the present disclosure, the signal decoder module is configured to determine a level difference between the at least two different levels, wherein the signal decoder module is configured to determine the at least one decision threshold based on the level difference. In some embodiments, the signal decoder module may be configured to determine a level difference between the highest level of the input signal samples and the lowest level of the input signal samples in order to determine the at least one decision threshold.

Alternatively or additionally, the signal decoder module may be configured to determine a level difference between the average over several levels of input signal samples being associated with a maximum level and the average over several levels of input signal samples being associated with a minimum level. The signal decoder module further may be configured to determine the at least one decision threshold based on the level difference of the averages.

In a further embodiment of the present disclosure, the signal decoder module is configured to determine the at least one decision threshold according to the equation $A_{th,i} = A_{max} - (2k+1) \, p \, \Delta A$ or according to the equation $A_{th,i} = A_{min} + (2k+1) \, p \, \Delta A$, wherein $A_{max}$ corresponds to a maximum level of the input signal samples, wherein $A_{min}$ corresponds to a minimum level of the input signal samples, wherein k is an integer equal to or bigger than zero, wherein $\Delta A$ corresponds to the level difference, and wherein p is a proportionality factor. In general, the proportionality factor p may depend on the actual modulation type of the input signal. In other words, the signal decoder module may be configured to determine the at least one decision threshold based on the maximum level of the input signal samples, the minimum level of the input signal samples, and based on the modulation-dependent proportionality factor p.

In some embodiments, the level difference $\Delta A$ is equal to the difference between the maximum level of the input signal samples and the minimum level of the input signal samples, i.e. $\Delta A = A_{max} - A_{min}$.

Alternatively, the level difference $\Delta A$ may be equal to the difference between the average over several levels of input signal samples being associated with the maximum level and the average over several levels of input signal samples being associated with the minimum level.

The signal decoder module may be configured to determine the proportionality factor based on an overall number of possible different levels of the symbol sequence. For several different types of modulations, the distance between neighboring levels of the symbol sequence is (approximately) constant. Accordingly, the proportionality factor may be determined directly based on the overall number N of possible different levels according to $p = 1/(2(N-1))$. This way, the decision thresholds are located half way between the respective pairs of neighboring levels.

According to another aspect of the present disclosure, the input signal is established as a pulse amplitude modulated (PAM)-N signal, wherein N is an integer bigger than 1. For example, the input signal may be established as a PAM-3 signal or as a PAM-4 signal. Accordingly, the signal analysis module described above may be used, e.g., for Gigabit Ethernet applications, for example according to the 1000Base-T1 standard.

Alternatively, the input signal may be established as a non-return-to-zero (NRZ) signal, among others.

In some embodiments, the signal decoder module is configured to decode the input signal based on the at least one decision threshold. In other words, the signal decoder module is configured to determine the symbol values of the individual symbols of the symbol sequence based on the at least one decision threshold.

According to another aspect of the present disclosure, the signal decoder module is configured to compare the level of the input signal with the at least one decision threshold in order to decode the input signal. In general, the decision thresholds define decision corridors that are each associated with one particular symbol value. Thus, the values of the individual symbols of the symbol sequence can be determined by identifying the respective decision corridor in which the input signal is located at a particular decision time.

In a further embodiment of the present disclosure, the signal decoder module is configured to compare the level of the input signal and the at least one decision threshold at symbol times, the symbol times being defined by the clock signal. In general, the symbol time is located in an inner portion of the respective symbol, for example in the middle of the respective symbol. In other words, the symbol time is located rather far away from potential signal edges and the usual deformations of the input signal being associated with the signal edges. Accordingly, the input signal can be decoded with higher precision by comparing the input signal and the at least one decision threshold at the symbol times rather than at the edge times.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
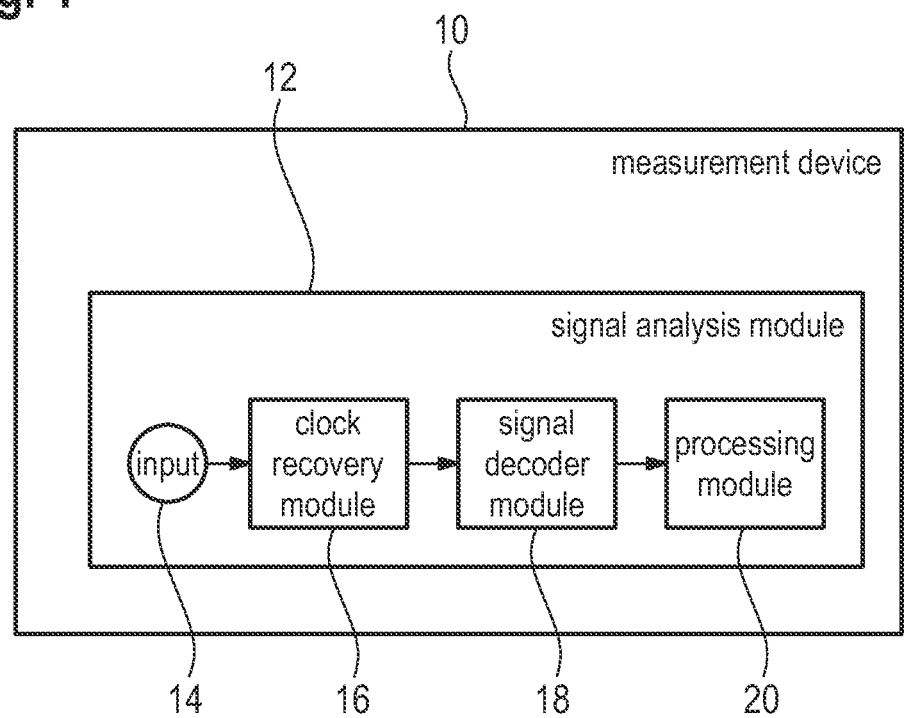
FIG. 1 schematically shows a block diagram of a signal analysis module according to an embodiment of the present disclosure.

FIG. 1 schematically shows a measurement device 10 comprising a signal analysis module 12. In various embodiments described herein, the term "module" is understood to describe suitable hardware, suitable software, or a combination of hardware and software that is configured to have a certain functionality. The hardware may, inter alia, comprise a CPU, a GPU, an FPGA, an ASIC, or other types of electronic circuitry.

In general, the measurement device 10 may be established as any type of measurement instrument being configured to analyze a pulse modulated signal. In some embodiments, the measurement device 10 may be established as an oscilloscope, as a signal analyzer, or as a vector network analyzer. Alternatively, the measurement device 10 may be established as a receiver being configured to decode a pulse modulated signal.

The signal analysis module 12 comprises an input 14, a clock recovery circuit or module 16, a signal decoder circuit or module 18, and a processing module 20 composed of, for example, one or more processor circuits. Generally speaking, the signal analysis module 12 is configured to analyze a pulse modulated input signal received via the input 14.

More precisely, the signal analysis module 12 is configured to perform a signal analysis method for analyzing a pulse modulated input signal that is described in the following with reference to FIG. 2.

A pulse modulated input signal is received via the input 14 (step S1).

The input signal may be generated by a device under test (if the measurement device 10 is established as a measurement instrument) or by any other signal source (e.g. if the measurement device 10 is established as a receiver).

In some embodiments, the input signal is established as a pulse amplitude modulated (PAM)-N signal, wherein N is an integer bigger than 1. For example, the input signal is established as a PAM-3 signal or as a PAM-4 signal. Alternatively, the input signal may be established as a non-return-to-zero (NRZ) signal, for example.

In some embodiments, the input signal may be established as a digital signal.

If the input signal is established as an analog signal, the input signal may be digitized by an analog-to-digital converter, and the steps described in the following may be performed based on the digitized input signal.

A clock signal being associated with the input signal is recovered by the clock recovery module 16 (step S2). In general, the input signal is generated based on an internal clock signal of the signal source generating the input signal. However, according to many data transmission standards, the clock signal is not transmitted together with the generated input signal. Thus, the receiver (i.e. the measurement device 10) needs to recover this information by a so-called clock data recovery (CDR).

In step S2, any suitable clock recovery method known in the state of the art may be employed.

The input signal is sampled based on the clock signal recovered previously, thereby obtaining a set of input signal samples (step S3). Step S3 is illustrated in FIG. 3, which shows a diagram of an amplitude A of the input signal $x_{in}$ plotted against time t.

The input signal $x_{in}$ is sampled after the clock recovery such that each input signal sample of the set of input signal samples $x_{sa}$ is associated with exactly one symbol of the symbol sequence. Each of the input signal samples has a certain level, namely the signal amplitude of the input signal $x_{in}$ at the respective sample time. The level of each input signal sample is constant for the symbol duration $T_S$ of the respective symbol, wherein the symbol duration $T_S$ is defined by the clock signal. In other words, the duration of each input signal sample is equal to the clock period of the clock signal.

Figure 3:
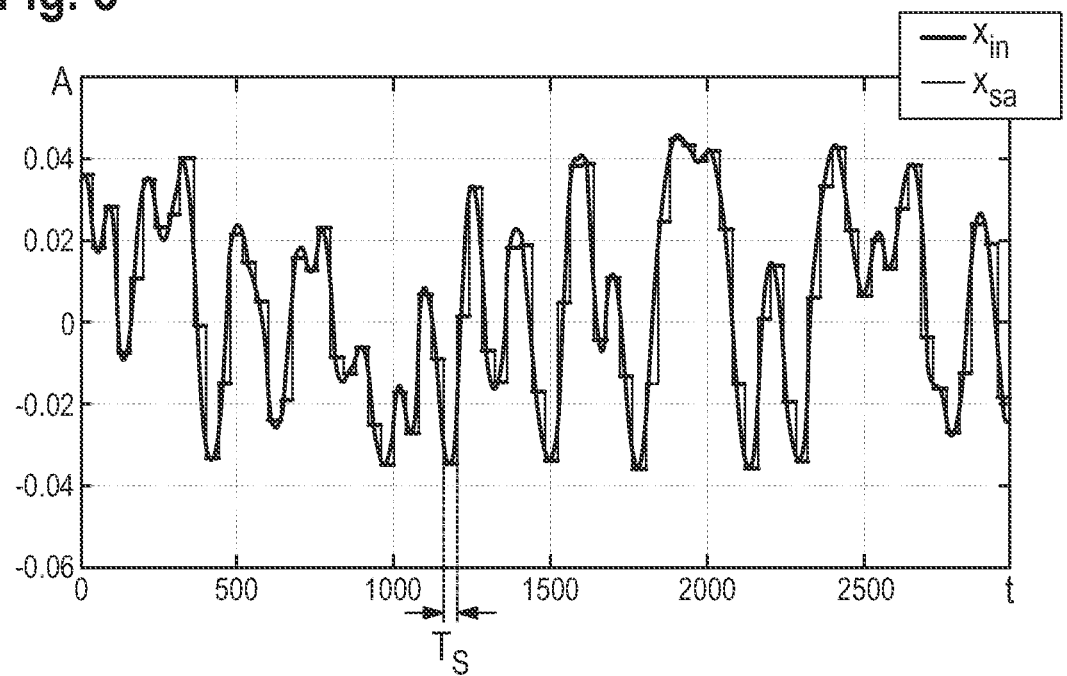
FIG. 3 shows a diagram of an input signal plotted against time.

It is noted that while the input signal $x_{in}$ is illustrated as a continuous line in FIG. 3, the input signal $x_{in}$ may as well consist of samples. If the input signal $x_{in}$ is already digital or digitized, the input signal $x_{in}$ may be re-sampled in order to obtain the set of input signal samples $x_{sa}$.

At least two different levels of at least two different input signal samples are determined, wherein the at least two different input samples are associated with at least two different symbols (step S4). Step S4 is illustrated in FIG. 4, which shows a diagram of an amplitude A of the set of input samples $x_{sa}$ obtained in step S3 plotted against time.

Figure 4:
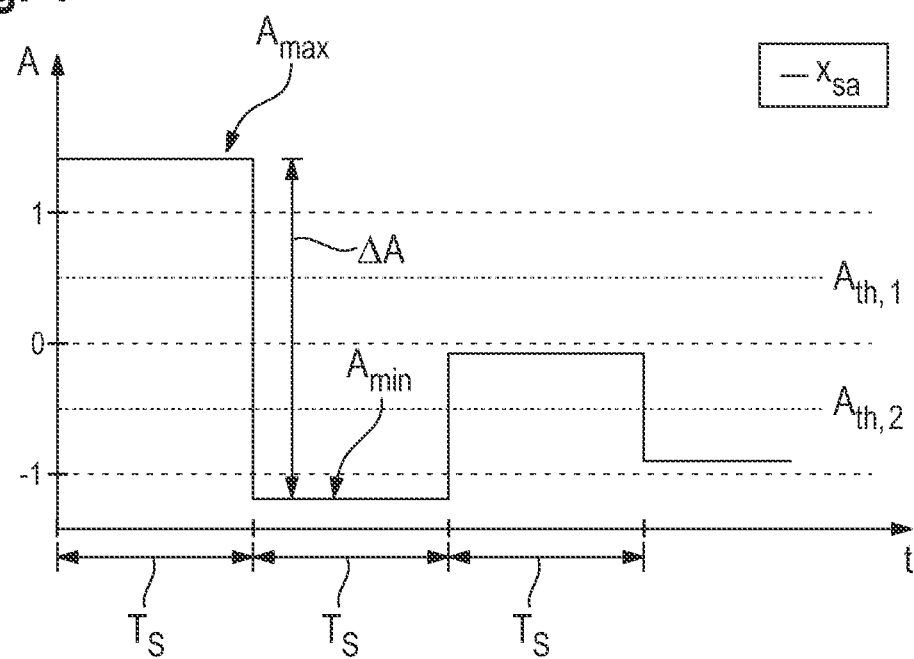
FIG. 4 shows a diagram illustrating several steps of the method of FIG. 2.

Without restriction of generality, the input signal corresponding to the set of input signal samples $x_{sa}$ in FIG. 4 is established as a PAM-3 coded signal. Accordingly, there are three possible symbol values for the individual symbols of the symbol sequence, which are denoted by "1", "0" and "−1" in FIG. 4.

The at least two different levels are associated with a maximum level of the symbol sequence (i.e. level "1" in the case of FIG. 4) and a minimum level of the symbol sequence (i.e. level "−1" in the case of FIG. 4). In some embodiments, the highest level $A_{max}$ and the lowest level $A_{min}$ occurring in the set of input signal samples $x_{sa}$ may be determined.

While a highest level $A_{max}$ of the set of input signal samples $x_{sa}$ may not be exactly equal to the designated level "1" of the symbol sequence, it is nonetheless clear that the highest level of the input signal samples is associated with the symbol level "1". Similarly, the lowest level $A_{min}$ of the input signal samples is associated with the symbol level "−1". Accordingly, the highest level $A_{max}$ and the lowest level $A_{min}$ constitute an estimate for the actual symbol levels "1" and "−1", respectively.

At least one decision threshold $A_{th,i}$, for example several decision thresholds $A_{th,i}$ are determined based on the at least two different levels determined previously (step S5). In some embodiments, the decision thresholds $A_{th,i}$ are determined based on the highest level $A_{max}$ and the lowest level $A_{min}$ of the set of input signal samples, and based on the modulation type of the input signal.

More precisely, the decision thresholds $A_{th,i}$ are determined according to the equation $$A_{th,i}=A_{max}-(2k+1)p\Delta A,$$

or according to the equation $$A_{th,i}=A_{min}+(2k+1)p\Delta A,$$

wherein k is an integer equal to or bigger than zero, and wherein $\Delta A$ corresponds to the level difference between the highest level $A_{max}$ and the lowest level $A_{min}$, i.e. $\Delta A = A_{max} - A_{min}$. Moreover, p is a proportionality factor.

In general, the proportionality factor p depends on the actual modulation type of the input signal. For several different types of modulations, e.g. for the class PAM-N modulations, the distance between neighboring levels of the symbol sequence is (approximately) constant. Accordingly, the proportionality factor can be determined directly based on the overall number N of possible different levels according to $p=1/(2(N-1))$. Moreover, the range of the integer k is also limited by the employed modulation. More precisely, k can run from 0 to N−2.

The resulting decision thresholds $A_{th,i}$ are located half way between respective pairs of neighboring levels of the symbol sequence.

In the particular example shown in FIG. 4, the first decision threshold $A_{th,1}$ may be obtained by setting k=0 and p=¼, such that $A_{th,1}=A_{max}-¼ \Delta A$.

The second decision threshold $A_{th,2}$ may be obtained by setting k=1 and p=¼, such that $A_{th,2}=A_{max}-¾ \Delta A$.

The input signal may be decoded based on the decision threshold(s) $A_{th,i}$ determined previously (step S6). In other words, the symbol values of the individual symbols of the symbol sequence are determined based on the decision threshold(s) $A_{th,i}$ determined previously.

In general, the decision thresholds $A_{th,i}$ define decision corridors that are each associated with one particular symbol value.

The level of the input signal and the decision threshold(s) may be compared at symbol times in order to decode the input signal, wherein the symbol times are defined by the clock signal.

In general, the symbol time is located in an inner portion of the respective symbol, for example in the middle of the respective symbol. In other words, the symbol time is located rather far away from potential signal edges and the usual deformations of the input signal being associated with the signal edges.

In the particular example shown in FIG. 4, a first decision corridor is located below the second decision threshold $A_{th,2}$. If the amplitude of the input signal lies below $A_{th,2}$ at a certain decision time (e.g. at the symbol time), the value of the current symbol is determined to be "−1".

A second decision corridor is located between the first decision threshold $A_{th,1}$ and the second decision threshold $A_{th,2}$. If the amplitude of the input signal lies within that decision corridor at the certain decision time (e.g. at the symbol time), the value of the current symbol is determined to be "0".

A third decision corridor is located above the first decision threshold $A_{th,1}$. If the amplitude of the input signal lies above $A_{th,1}$ at the certain decision time (e.g. at the symbol time), the value of the current symbol is determined to be "1".

The decoded input signal and the recovered clock signal may be forwarded to the processing module 20 for further processing and/or analysis of the input signal.

For example, the processing module may analyze certain properties of the input signal based on the decoded input signal and/or based on the recovered clock signal, e.g. properties being related to a signal integrity of the input signal, such as noise and jitter comprised in the input signal.

With the signal analysis method described above, the decision threshold(s) can be determined with high accuracy, as the input signal samples used for determining the at least two different levels carry less perturbations compared to the original input signal. Accordingly, the input signal can be decoded with a small symbol error rate.

Moreover, no user input is required, for example no user input regarding the decision thresholds. Instead, the signal analysis method described above can be performed in a fully automatic manner.

Figure 2:
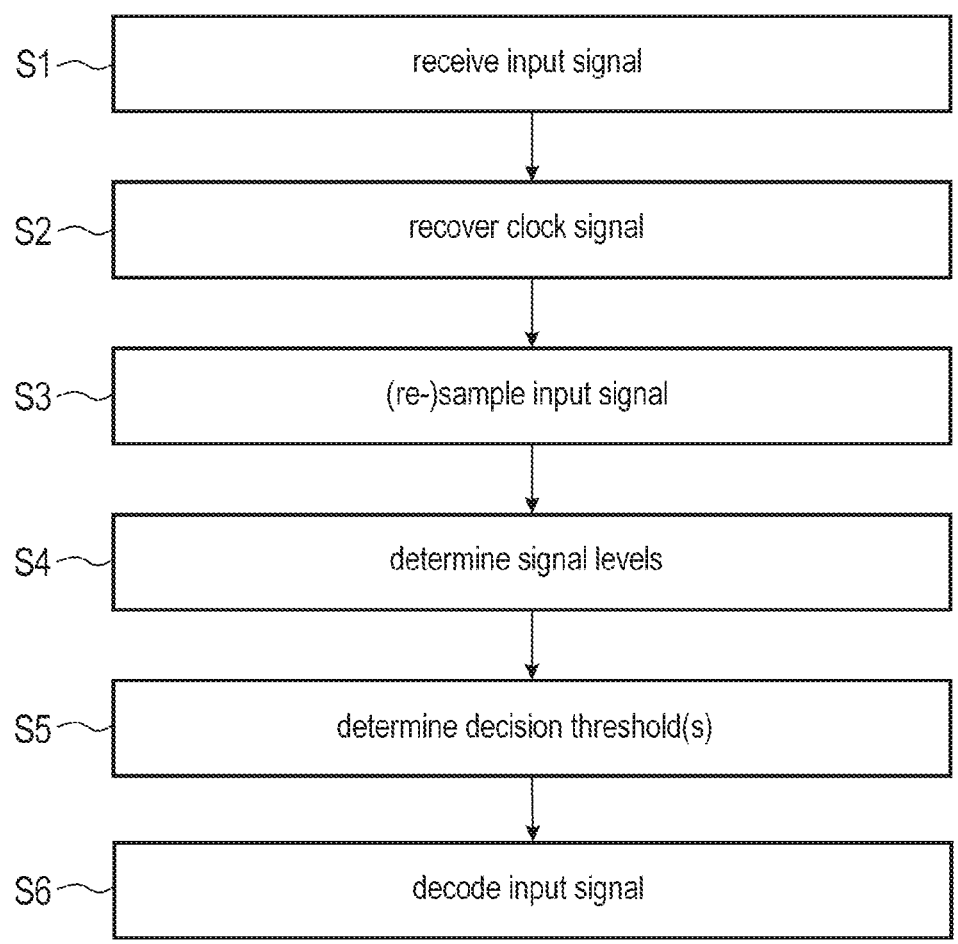
FIG. 2 shows a flow chart of a representative signal analysis method according to an embodiment of the present disclosure.

The measurement device 10 and/or the signal analysis module 12, including such components as, for example, a clock recovery module 16, a signal decoder module 18, and the processing module 20, etc., is configured to perform one or more steps schematically shown, for example, in FIG. 2. In some embodiments, one or more of these components includes one or more computer-readable media containing computer readable instructions embodied thereon that, when executed by one or more computer circuits (contained in or associated with the measurement device 10 or components thereof), cause the one or more computer circuits to perform one or more steps of the method of FIG. 2 described above. In some embodiments, the one or more computer circuits, sometimes referred to as computing devices, includes a microprocessor, a microcontroller, a central processing unit, a graphics processing unit (GPU), a digital signal processor (DSP), an application specific integrated circuit (ASIC), etc.

In some embodiments, the one or more computer-readable media contains computer readable instructions embodied thereon that, when executed by the one or more computer circuits, cause the one or more computer circuits to perform one or more steps of any of the methods of claims 1-10.

As described briefly above, certain embodiments disclosed herein utilize circuitry (e.g., one or more circuits) in order to implement standards, protocols, methodologies or technologies disclosed herein, operably couple two or more components, generate information, process information, analyze information, store information, display information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices or computer circuits such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the modules, units, etc., described above, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A signal analysis method for analyzing a pulse modulated input signal, the signal analysis method comprising:
   receiving the pulse modulated input signal, the input signal comprising a symbol sequence;
   recovering a clock signal from the input signal, the clock signal being associated with the input signal;
   sampling the input signal based on the clock signal, thereby obtaining a set of input signal samples, each of the input signal samples having a certain level being constant over time,
   determining at least two different levels of input signal samples being associated with different symbols of the symbol sequence; and
   determining at least one decision threshold based on the at least two different levels determined previously, the decision threshold being associated with a symbol transition of the symbol sequence,
   wherein a level difference between the at least two different levels is determined, and wherein the at least one decision threshold is determined based on the level difference.

2. The signal analysis method of claim 1, wherein the at least two different levels are associated with a maximum level of the symbol sequence and a minimum level of the symbol sequence, respectively.

3. The signal analysis method of claim 1, wherein at least one of an average over several levels of input signal samples being associated with a maximum level, and an average over several levels of input signal samples being associated with a minimum level is determined.

4. The signal analysis method of claim 1, wherein the at least one decision threshold $A_{th}$ is determined according to the equation $A_{th,i} = A_{max} - (2k+1)\, p\, \Delta A$ or according to the equation $A_{th,i} = A_{min} + (2k+1)\, p\, \Delta A$, wherein $A_{max}$ corresponds to a maximum level of the input signal samples, wherein $A_{min}$ corresponds to a minimum level of the input signal samples, wherein k is an integer equal to or bigger than zero, wherein $\Delta A$ corresponds to the level difference, and wherein p is a proportionality factor.

5. The signal analysis method of claim 4, wherein the proportionality factor is determined based on an overall number of possible different levels of the symbol sequence.

6. The signal analysis method of claim 1, wherein the input signal is established as a pulse amplitude modulated (PAM)-N signal, wherein N is an integer bigger than 1.

7. The signal analysis method of claim 1, wherein the input signal is decoded based on the at least one decision threshold.

8. The signal analysis method of claim 7, wherein a level of the input signal is compared with the at least one decision threshold in order to decode the input signal.

9. The signal analysis method of claim 8, wherein the level of the input signal and the at least one decision threshold are compared at symbol times, the symbol times being defined by the clock signal.

10. A signal analysis apparatus for analyzing a pulse modulated input signal, the signal analysis apparatus comprising an input, a clock recovery circuit, and a signal decoder circuit,
    the input being configured to receive a pulse modulated input signal, the input signal comprising a symbol sequence,
    the clock recovery circuit being configured to recover a clock signal from the input signal, the clock signal being associated with the input signal,
    the signal decoder circuit being configured to sample the input signal based on the clock signal, thereby obtaining a set of input signal samples, each of the input signal samples having a certain level being constant over time,
    the signal decoder circuit being configured to determine at least two different levels input signal samples being associated with different symbols of the symbol sequence, and
    the signal decoder circuit further being configured to determine at least one decision threshold based on the at least two different levels, the decision threshold being associated with a symbol transition of the symbol sequence,
    wherein the signal decoder circuit is configured to determine a level difference between the at least two different levels, and wherein the signal decoder circuit is configured to determine the at least one decision threshold based on the level difference.

11. The signal analysis apparatus of claim 10, wherein the at least two different levels are associated with at least one of a maximum level of the symbol sequence and a minimum level of the symbol sequence, respectively.

12. The signal analysis apparatus of claim 10, wherein the signal decoder circuit is configured to determine at least one of an average over several levels of input signal samples being associated with a maximum level, and an average over several levels of input signal samples being associated with a minimum level.

13. The signal analysis apparatus of claim 10, wherein the signal decoder circuit is configured to determine the at least one decision threshold according to the equation $A_{th,i} = A_{max} - (2k+1) \, p \, \Delta A$ or according to the equation $A_{th,i} = A_{min} + (2k+1) \, p \, \Delta A$, wherein $A_{max}$ corresponds to a maximum level of the input signal samples, wherein $A_{min}$ corresponds to a minimum level of the input signal samples, wherein k is an integer equal to or bigger than zero, wherein $\Delta A$ corresponds to the level difference, and wherein p is a proportionality factor.

14. The signal analysis apparatus of claim 13, wherein the signal decoder circuit is configured to determine the proportionality factor based on an overall number of possible different levels of the symbol sequence.

15. The signal analysis apparatus of claim 10, wherein the input signal is established as a pulse amplitude modulated (PAM)-N signal, wherein N is an integer bigger than 1.

16. The signal analysis apparatus of claim 10, wherein the signal decoder circuit is configured to decode the input signal based on the at least one decision threshold.

17. The signal analysis apparatus of claim 16, wherein the signal decoder circuit is configured to compare the level of the input signal with the at least one decision threshold in order to decode the input signal.

18. The signal analysis apparatus of claim 17, wherein the signal decoder circuit is configured to compare the level of the input signal and the at least one decision threshold at symbol times, the symbol times being defined by the clock signal.

19. A signal analysis apparatus for analyzing a pulse modulated input signal, the signal analysis apparatus comprising an input, a clock recovery circuit, and a signal decoder circuit, the input being configured to receive a pulse modulated input signal, the input signal comprising a symbol sequence, the clock recovery circuit being configured to recover a clock signal from the input signal, the clock signal being associated with the input signal, the signal decoder circuit being configured to sample the input signal based on the clock signal, thereby obtaining a set of input signal samples, each of the input signal samples having a certain level being constant over time, the signal decoder circuit being configured to determine at least two different levels input signal samples being associated with different symbols of the symbol sequence, and the signal decoder circuit further being configured to determine at least one decision threshold based on the at least two different levels, the decision threshold being associated with a symbol transition of the symbol sequence, wherein the signal decoder circuit is configured to determine at least one of an average over several levels of input signal samples being associated with a maximum level, and an average over several levels of input signal samples being associated with a minimum level.

* * * * *

UNITED STATES PATENT AND TRADEMARK OFFICE
CERTIFICATE OF CORRECTION

PATENT NO. : 11,316,506 B1
APPLICATION NO. : 17/070711
DATED : April 26, 2022
INVENTOR(S) : A. Schaefer et al.

Page 1 of 1

It is certified that error appears in the above-identified patent and that said Letters Patent is hereby corrected as shown below:

In the Claims

| Column | Line | |
|--------|------|---|
| 12 | 51 | in Claim 10, change "levels input" to -- levels of input --. |
| 14 | 19 | in Claim 19, change "levels input" to -- levels of input --. |

Signed and Sealed this
Twentieth Day of June, 2023

Katherine Kelly Vidal
*Director of the United States Patent and Trademark Office*